(12) United States Patent
Sivananthan et al.

(10) Patent No.: US 9,837,563 B2
(45) Date of Patent: Dec. 5, 2017

(54) MBE GROWTH TECHNIQUE FOR GROUP II-VI INVERTED MULTIJUNCTION SOLAR CELLS

(75) Inventors: Sivalingam Sivananthan, Naperville, IL (US); James W. Garland, Aurora, IL (US); Michael W. Carmody, Western Springs, IL (US)

(73) Assignee: EPIR Technologies, Inc., Bolingbrook, IL (US)

( * ) Notice: Subject to any disclaimer, the term of this patent is extended or adjusted under 35 U.S.C. 154(b) by 272 days.

(21) Appl. No.: 12/641,049

(22) Filed: Dec. 17, 2009

(65) Prior Publication Data

US 2011/0151616 A1 Jun. 23, 2011

(51) Int. Cl.
| | |
|---|---|
| H01L 21/06 | (2006.01) |
| H01L 31/0296 | (2006.01) |
| H01L 31/073 | (2012.01) |
| H01L 31/18 | (2006.01) |
| H01L 21/02 | (2006.01) |

(52) U.S. Cl.
CPC ........ H01L 31/0296 (2013.01); H01L 31/073 (2013.01); H01L 31/1836 (2013.01); H01L 31/1892 (2013.01); H01L 21/0248 (2013.01); H01L 21/02381 (2013.01); H01L 21/02395 (2013.01); H01L 21/02469 (2013.01); H01L 21/02485 (2013.01); Y02E 10/543 (2013.01); Y02P 70/521 (2015.11)

(58) Field of Classification Search
USPC ........................................................ 438/102
See application file for complete search history.

(56) References Cited

U.S. PATENT DOCUMENTS

| | | | |
|---|---|---|---|
| 4,710,589 A | 12/1987 | Meyers et al. | |
| 4,753,684 A | 6/1988 | Ondris et al. | |
| 5,306,386 A * | 4/1994 | de Lyon | .................. C30B 23/02 |
| | | | 117/105 |
| 6,346,458 B1 | 2/2002 | Bower | |
| 6,419,742 B1 * | 7/2002 | Kirk et al. | ....................... 117/84 |
| 6,812,547 B2 | 11/2004 | Bower | |

(Continued)

OTHER PUBLICATIONS

Stan, M., et al, "Very high efficiency triple junction solar cells grown by MOVPE," Journal of Crystal Growth 310, Nov. 15, 2008, pp. 5204-5208, Issue 23.

(Continued)

*Primary Examiner* — Shaun Campbell
(74) *Attorney, Agent, or Firm* — Erickson Law Group, PC (57) ABSTRACT

A method of forming a Group II-VI multijunction semiconductor device comprises providing a Group IV substrate, forming a first subcell from a first Group II-VI semiconductor material, forming a second subcell from a second Group II-VI semiconductor material, and removing the substrate. The first subcell is formed over the substrate and has a first bandgap, while the second subcell is formed over the first subcell and has a second bandgap which is smaller than the first bandgap. Additional subcells may be formed over the second subcell with the bandgap of each subcell smaller than that of the preceding subcell and with each subcell preferably separated from the preceding subcell by a tunnel junction. Prior to the removal of the substrate, a support layer is affixed to the last-formed subcell in opposition to the substrate.

37 Claims, 3 Drawing Sheets

(56) References Cited

U.S. PATENT DOCUMENTS

| | | |
|---|---|---|
| 6,951,819 B2 * | 10/2005 | Iles et al. .................. 438/705 |
| 7,901,975 B2 | 3/2011 | Chen |
| 8,084,682 B2 | 12/2011 | Chen |
| 8,912,428 B2 | 12/2014 | Sivananthan et al. |
| 2007/0197022 A1 * | 8/2007 | Hails .................. C30B 23/02 |
| | | 438/625 |
| 2008/0029151 A1 | 2/2008 | McGlynn et al. |
| 2008/0090390 A1 * | 4/2008 | Yamamoto et al. ......... 438/505 |
| 2008/0149173 A1 | 6/2008 | Sharps |
| 2009/0223554 A1 | 9/2009 | Sharps |
| 2009/0229659 A1 * | 9/2009 | Wanlass ............. H01L 31/0725 |
| | | 136/255 |
| 2010/0025655 A1 * | 2/2010 | Duong et al. ................. 257/13 |
| 2011/0062446 A1 * | 3/2011 | Goyal ........................... 257/64 |
| 2011/0155208 A1 * | 6/2011 | Wang ........................... 136/244 |

OTHER PUBLICATIONS

Geisz, J.F. et al, "40.8% efficient inverted triple junction solar cell with two independently metamorphic junctions," Applied Physics Letters 93, 123505, 2008.

Geisz, J.F. et al, "In situ stress measurement for MOVPE growth of high efficiency lattice-mismatched solar cells," Journal of Crystal Growth 310, Apr. 15, 2008, pp. 2339-2344, Issues 7-9.

Geisz, J.F. et al, "High-efficiency GaInP/GaAs/InGaAs triple junction solar cells grown inverted with a metamorphic bottom junction," Applied Physics Letters 91, 023502, 2007.

* cited by examiner

MBE GROWTH TECHNIQUE FOR GROUP II-VI INVERTED MULTIJUNCTION SOLAR CELLS

BACKGROUND OF THE INVENTION

The invention generally relates to a method of forming epitaxial layers of semiconducting materials, metals, and insulators, which may be used in the production of photodetectors and photovoltaic cells.

Photovoltaic cells have many applications. Solar cell systems may be connected to an electric utility grid or be used independently. Applications include water heating, residential electric power, electric power for buildings, generation of power for electric utilities, applications in space, military applications, electric power for automobiles, airplanes, etc., and low-power specialty applications. Solar cells may be used in rooftop systems, in sheets rolled out on large flat areas in the desert or elsewhere, on systems that track the motion of the sun to gain the maximum incident solar power, with or without lenses and/or curved reflectors to concentrate the sun's light on small cells, in folding arrays on satellites and spacecraft, on the surfaces of automobiles, aircraft and other objects and even embedded in fabric for clothing, tents, etc.

The primary function of a photovoltaic cell is to convert electromagnetic radiation, in particular solar radiation, into electrical energy. The energy delivered by solar radiation at the earth's surface primarily contains photons of energy hv in the range 0.7 eV up to 3.5 eV, mostly in the visible range, with hv related to the wavelength λ of the light by hv=1.24 eV/λ (μm). Although many photons of longer wavelength are incident at the earth's surface they carry little energy.

In a semiconductor, the lowest conduction band and the highest valence band are separated in energy by a bandgap, $E_g$. A semiconductor is transparent to electromagnetic radiation with photons of energy hv less than $E_g$. On the other hand, electromagnetic radiation with $hv \geq E_g$ is absorbed. When a photon is absorbed in a semiconductor, an electron is optically excited out of the valence band into the conduction band, leaving a hole (an absence of an electron in a state that normally is filled by an electron) behind. Optical absorption in semiconductors is characterized by the absorption coefficient. The optical process is known as electron-hole pair generation. Electron-hole pairs in semiconductors tend to recombine by releasing thermal energy (phonons) or electromagnetic radiation (photons) with the conservation of energy and momentum.

Most semiconductor devices, including semiconductor solar cells, are based on the p-n junction diode. When incident photons with energy greater than or equal to the bandgap of the semiconductor p-n junction diode are absorbed, electron-hole pairs are generated. Electron-hole pairs generated by the incident photons with energy greater than the bandgap are called hot carriers. These photogenerated hot electrons and holes, which in direct-bandgap semiconductors reside in the energy band away from the energy band zone center, rapidly give away their excess energy (the energy difference between the total carrier energy and the energy gap) to the semiconductor crystal lattice causing crystal lattice vibrations (phonons), which produce an amount of heat equal to the excess energy of the carriers in the semiconductor. As a result of the photogenerated electrons and holes moving in opposite directions under an electric field within the semiconductor p-n junction diode, electron and hole photocurrents are simultaneously generated. Semiconductor devices based on this operating principle are known as photodiodes. Semiconductor photovoltaic solar cells are based on the same operating principle as the semiconductor p-n junction photodiodes described above.

In order to achieve the highest overall efficiency, photovoltaic cells may comprise a number of subcells that are stacked on top of one another. As the light passes from the incident face of the photovoltaic cell, the light passes through the stacked subcells, each of which has a subsequently smaller energy gap. This grading of the energy gaps from cell to cell reduces the energy lost as heat and increases the overall efficiency of the photovoltaic cell.

The most common method for forming multijunction solar cell structures is to grow successive epilayers of semiconductor material as by metal organic chemical vapor deposition (MOCVD) or molecular beam epitaxy (MBE) with increasing bandgaps on a substrate. Thus, the lowest cell having the lowest bandgap is grown first and subsequent subcells with higher bandgaps are grown on top of the first subcell. Usually the substrate has the lowest energy gap and is used as the bottom subcell in a solar cell.

Alternatively, U.S. Pat. No. 6,951,819 to Iles et al. describes a method of forming a Group III-V solar cell wherein the first epilayer grown has the highest bandgap and each subsequent epilayer grown has a smaller bandgap than the epilayer below it. However, column 1, lines 37-63 of Iles states that the possible bandgap values are limited because the crystal structure and lattice constants of the different layers of the Group III-V materials must be matched to each other in order to maintain the necessary electronic properties. Stated another way, each layer of Group III-V material must have essentially the same lattice constant, or distance between neighboring atoms, as every other layer and as the substrate in order to obtain a high-efficiency solar cell. The lattice constant of each layer, however, is affected by the chemical composition of the layer because different sizes of atoms give different interatomic distances.

Thus, the requirement of matching the lattice constant of each layer to that of the substrate directly limits the allowed compositions of the layers and, therefore, the possible bandgaps. If the lattices did not have to be matched, different compositions could be used to adjust the bandgap of each layer. This would lead to more efficient photovoltaic cells.

Thus, there is a need for a process for forming semiconducting layers that allows one to choose the bandgap for each layer without regard to lattice matching, while maintaining acceptable electronic properties.

SUMMARY OF THE INVENTION

The Applicants have discovered that the problem described above can be solved through the use of Group II-VI semiconductors, because these materials maintain acceptable electronic properties even if grown with substantial lattice mismatches. Thus, the Group II-VI materials are not limited by the same lattice matching requirement as Group III-V materials and the composition of the layers is no longer limited. This means that the bandgaps of Group II-VI materials may be chosen for optimal performance.

Further, the Applicants have discovered that the structure is more stable if layers with higher bandgaps are grown first and each subsequent layer that is deposited has a smaller bandgap. This method results in a more robust photovoltaic cell.

According to one aspect of the invention, a method of forming a Group II-VI multijunction semiconductor device comprises the steps of providing a Group IV substrate and forming a first subcell from a first Group II-VI semiconductor material to be adjacent to the substrate. The method further comprises forming a second subcell from a second Group II-VI semiconductor material over the first subcell, and removing the substrate. The first layer has a first bandgap and the second layer has a second bandgap smaller than the first bandgap. The method may also comprise adding support and contacting layers above the second cell before removing the substrate.

In preferred embodiments, the device typically includes a tunnel junction between each subcell. The Group II-VI semiconductor materials may be selected from CdTe, $Cd_wMn_{1-w}Te$, $Hg_xCd_{1-x}Te$, $Cd_yZn_{1-y}Te$, $Cd_zMg_{1-z}Te$, CdSe, $Cd_aMn_{1-a}Se$, $Hg_bCd_{1-b}Se$, $Cd_cZn_{1-c}Se$, $Cd_dMg_{1-d}Se$, and combinations thereof, with w, x, y, z, a, b, c, and d each having a value between 0 and 1.

Preferably, the method includes the step of forming a third subcell from a third Group II-VI semiconductor material having a third bandgap smaller than the second bandgap. Each subcell has a homojunction and the semiconductor device is a photovoltaic cell.

More preferably, the method also includes the step of forming a fourth subcell from a fourth Group II-VI semiconductor material having a fourth bandgap smaller than the third bandgap. The absence of a lattice matching requirement for Group II-VI semiconductor materials, or the use of CdTe, $Cd_zMg_{1-z}Te$ and $Hg_xCd_{1-x}Te$ would allow the use of four or more subcells to obtain even higher efficiencies.

BRIEF DESCRIPTION OF THE DRAWINGS

Further aspects of the invention and their advantages can be discerned in the following detailed description, in which like characters denote like parts and in which.

DETAILED DESCRIPTION

Figure 1:
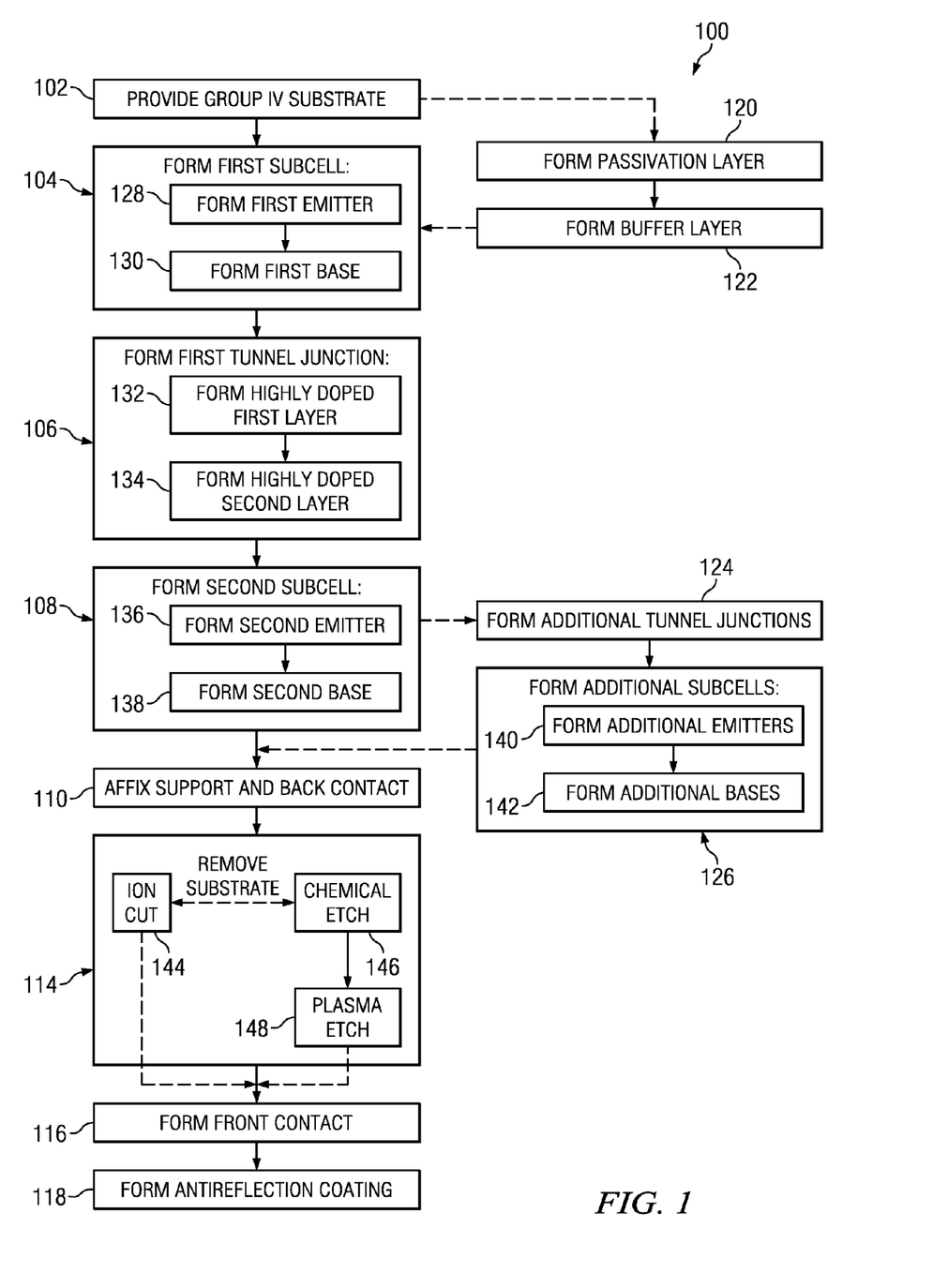
FIG. 1 is a process flow diagram showing a method for forming a Group II-VI multijunction semiconductor device.
Figure 2:
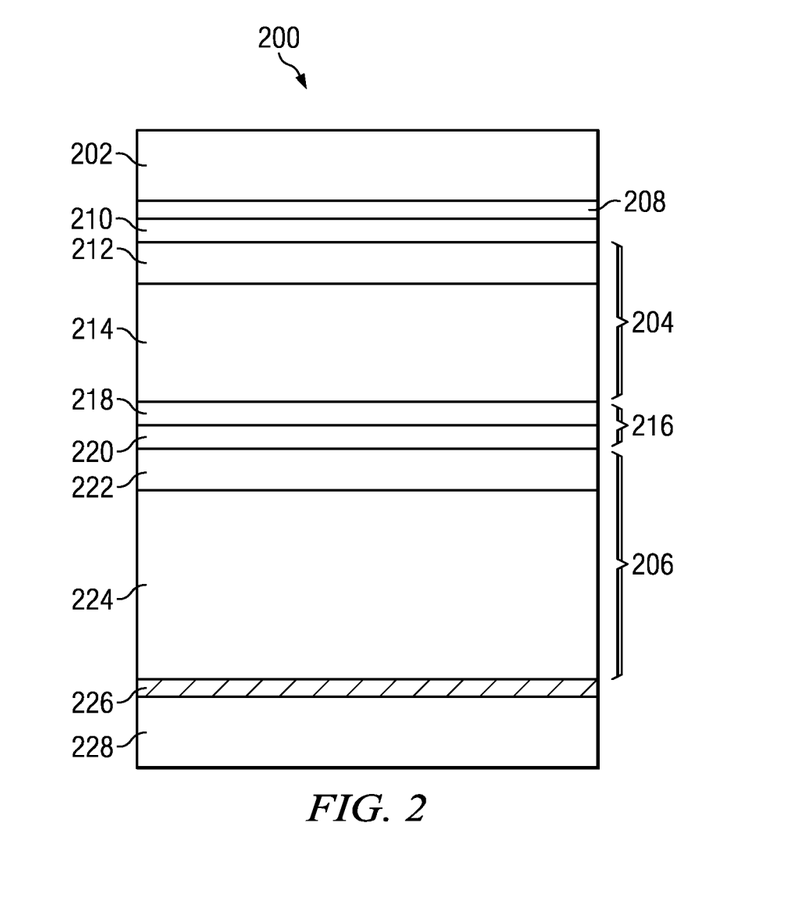
FIG. 2 is a highly magnified schematic elevational sectional view showing a two-subcell photovoltaic cell formed according to one embodiment of the invention.

Referring to FIGS. 1 and 2, a method, indicated generally at 100, for forming a Group II-VI semiconductor device such as a photovoltaic cell, indicated generally at 200, comprises the steps of providing (102) a Group IV substrate 202, forming (104) a first subcell 204 from a first Group II-VI semiconductor material, forming (106) an $n^{++}/p^{++}$ tunnel junction 216, forming (108) a second subcell 206 from a second Group II-VI semiconductor material, forming (110) a contacting layer 226 above the second subcell 206 and a support layer 228. Additionally, the method includes the step of removing (114) the substrate 202. The first subcell 204 is formed to be adjacent to the substrate 202 and has a first bandgap. The second subcell 206 is formed over the first subcell 204 and has a second bandgap that is smaller than the first bandgap.

The substrate 202 may be made of any Group IV material such as Ge, strained silicon-germanium, SOI, Si, or GaAs, but Si is preferred because it is more robust, is available in the largest area, and is inexpensive. The Group II-VI semiconductor materials may be selected from CdTe, $Cd_wMn_{1-w}Te$, $Hg_xCd_{1-x}Te$, $Cd_yZn_{1-y}Te$, $Cd_zMg_{1-z}Te$, CdSe, $Cd_aMn_{1-a}Se$, $Hg_bCd_{1-b}Se$, $Cd_cZn_{1-c}Se$, $Cd_dMg_{1-d}Se$, and combinations thereof, where $0<w<1$, $0<x<1$, $0<y<1$, $0<z<1$, $0<a<1$, $0<b<1$, $0<c<1$, and $0<d<1$. The semiconducting device may contain one, two, or more layers of any of these semiconductor alloys. In cases in which the same material is used more than once in a cell, the second composition is denoted with a prime. Thus, in a preferred embodiment, the third and fourth subcells 308 and 312 (FIG. 3), have different bandgaps but are each formed of a mercury cadmium telluride alloy, denoted as $Hg_xCd_{1-x}Te$ and $Hg_{x'}Cd_{1-x'}Te$, respectively, where $0<x<x'<1$. Other repeating layers of materials are denoted similarly.

The individual layers of the photovoltaic cell 200 may be formed through a variety of processes such as MOCVD and MBE, but MBE is preferred because it is less expensive, allows more rapid expansion of manufacturing capacity, allows the layers to be formed in a single run and is a less toxic process. Each subcell 204, 206 has a homojunction.

The step of forming (104) the first subcell 204 comprises the substeps of forming (128) a first emitter 212 having a first conductivity type to be adjacent to the substrate 202 and forming (130) a first base 214 having a second conductivity type on the first emitter 212. The second conductivity type is opposite the first conductivity type.

Prior to forming (104) the first subcell 204, additional layers may be formed to enhance the properties of the device 200. Thus, the method may further comprise the steps of forming (120) a passivation layer 208, preferably including arsenic, on the substrate 202 and forming (122) a buffer layer 210, preferably of zinc telluride, on the passivation layer 208.

Moreover, the method may include forming (126) additional subcells from Group II-VI semiconductor alloys. Thus, to build the four-subcell structure shown by way of example in FIG. 3, the method may include the step of forming (126) a third subcell 308 from a third Group II-VI semiconductor alloy over the second subcell 206, the third subcell 308 having a third bandgap that is smaller than the second bandgap. Additionally, step 126 may include forming a fourth subcell 312 from a fourth Group II-VI semiconductor alloy over the third subcell 308, the fourth subcell 312 having a fourth bandgap that is smaller than the third bandgap.

Figure 3:
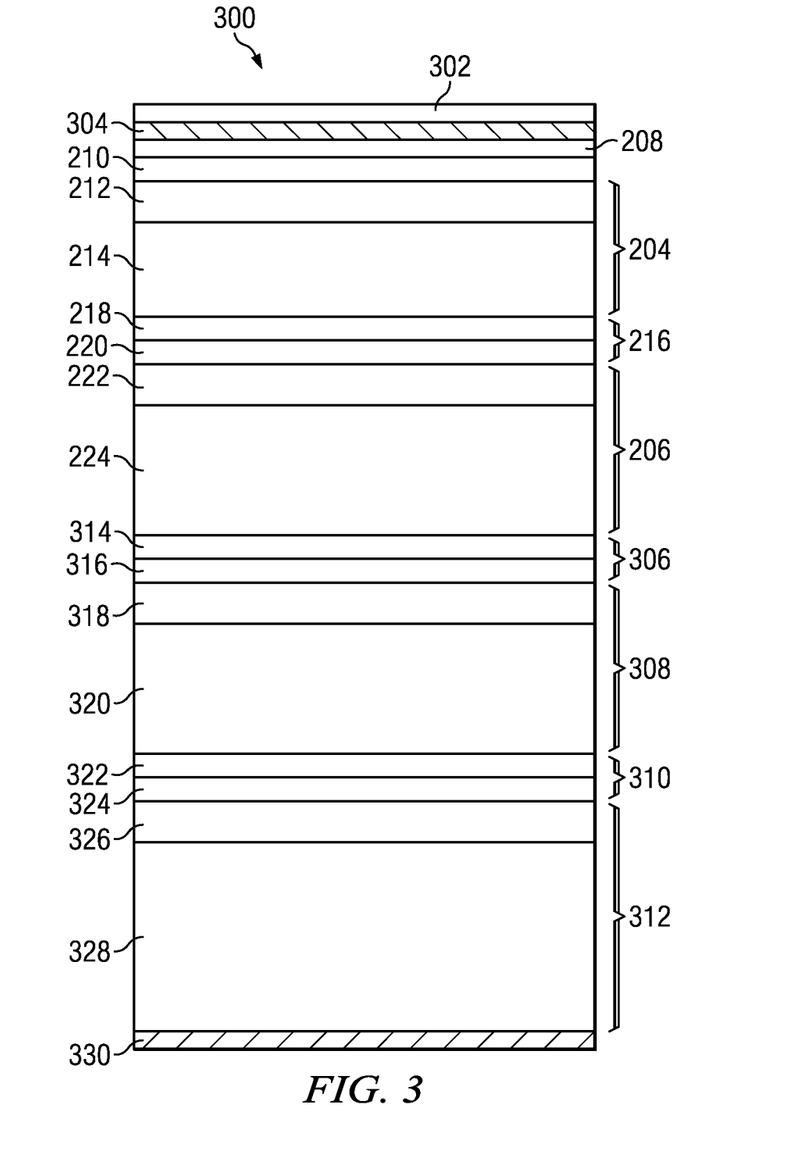
FIG. 3 is a highly magnified schematic elevational sectional view showing a four-subcell photovoltaic cell formed according to another embodiment of the invention.

As with forming (104) the first subcell 204, the step of forming (108) the second subcell 206 includes the substeps of forming (136) a second emitter 222 and forming (138) a second base 224. Similarly, the step of forming (126) additional subcells 308, 312 includes the substeps of forming (140) additional emitters 318 and 326 and forming (142) additional bases 320 and 328. The subsequent emitters and bases have opposite conductivity types. Table 1 below shows various preferred three-cell embodiments.

TABLE 1

| No. | 1st Layer Bandgap/Composition | 2nd Layer Bandgap/Composition | 3rd Layer Bandgap/Composition |
|---|---|---|---|
| 1 | 1.96 eV/$Cd_yZn_{1-y}Te$ | 1.4 eV/$Hg_xCd_{1-x}Te$ | 0.95 eV/$Hg_{x'}Cd_{1-x'}Te$ |
| 2 | 1.96 eV/$Cd_zMg_{1-z}Te$ | 1.4 eV/$Hg_xCd_{1-x}Te$ | 0.95 eV/$Hg_{x'}Cd_{1-x'}Te$ |
| 3 | 2.04 eV/$Cd_yZn_{1-y}Te$ | 1.5 eV/CdTe | 1.08 eV/$Hg_xCd_{1-x'}Te$ |

TABLE 1-continued

| No. | 1st Layer Bandgap/Composition | 2nd Layer Bandgap/Composition | 3rd Layer Bandgap/Composition |
|---|---|---|---|
| 4 | 2.04 eV/$Cd_zMg_{1-z}Te$ | 1.5 eV/CdTe | 1.08 eV/$Hg_xCd_{1-x'}Te$ |
| 5 | 1.96 eV/$Cd_wMn_{1-w}Te$ | 1.4 eV/$Hg_xCd_{1-x}Te$ | 0.95 eV/$Hg_xCd_{1-x'}Te$ |
| 6 | 2.04 eV/$Cd_wMn_{1-w}Te$ | 1.5 eV/CdTe | 1.08 eV/$Hg_xCd_{1-x'}Te$ | where $0 < w \leq 1$, $0 \leq x < x' < 1$; $0 < y \leq 1$, and $0 < z \leq 1$.

Table 2 shows various preferred four-cell embodiments.

TABLE 2

| No. | 1st Layer Bandgap/Composition | 2nd Layer Bandgap/Composition | 3rd Layer Bandgap/Composition | 4th Layer Bandgap/Composition |
|---|---|---|---|---|
| 1 | 2.08 eV/$Cd_yZn_{1-y}Te$ | 1.55 eV/$Cd_{y'}Zn_{1-y'}Te$ | 1.16 eV/$Hg_xCd_{1-x}Te$ | 0.75 eV/$Hg_xCd_{1-x'}Te$ |
| 2 | 2.08 eV/$Cd_yZn_{1-y}Te$ | 1.55 eV/$Cd_zMg_{1-z}Te$ | 1.16 eV/$Hg_xCd_{1-x}Te$ | 0.75 eV/$Hg_xCd_{1-x'}Te$ |
| 3 | 2.08 eV/$Cd_zMg_{1-z}Te$ | 1.55 eV/$Cd_yZn_{1-y}Te$ | 1.16 eV/$Hg_xCd_{1-x}Te$ | 0.75 eV/$Hg_xCd_{1-x'}Te$ |
| 4 | 2.08 eV/$Cd_zMg_{1-z}Te$ | 1.55 eV/$Cd_{z'}Mg_{1-z'}Te$ | 1.16 eV/$Hg_xCd_{1-x}Te$ | 0.75 eV/$Hg_xCd_{1-x'}Te$ |
| 5 | 2.04 eV/$Cd_yZn_{1-y}Te$ | 1.50 eV/CdTe | 1.10 eV/$Hg_xCd_{1-x}Te$ | 0.68 eV/$Hg_xCd_{1-x'}Te$ |
| 6 | 2.04 eV/$Cd_zMg_{1-z}Te$ | 1.50 eV/CdTe | 1.10 eV/$Hg_xCd_{1-x}Te$ | 0.68 eV/$Hg_xCd_{1-x'}Te$ |
| 7 | 2.08 eV/$Cd_yZn_{1-y}Te$ | 1.55 eV/$Cd_wMn_{1-w}Te$ | 1.16 eV/$Hg_xCd_{1-x}Te$ | 0.75 eV/$Hg_xCd_{1-x'}Te$ |
| 8 | 2.08 eV/$Cd_wMn_{1-w}Te$ | 1.55 eV/$Cd_yZn_{1-y}Te$ | 1.16 eV/$Hg_xCd_{1-x}Te$ | 0.75 eV/$Hg_xCd_{1-x'}Te$ |
| 9 | 2.08 eV/$Cd_wMn_{1-w}Te$ | 1.55 eV/$Cd_{w'}Mn_{1-w'}Te$ | 1.16 eV/$Hg_xCd_{1-x}Te$ | 0.75 eV/$Hg_xCd_{1-x'}Te$ |
| 10 | 2.04 eV/$Cd_wMn_{1-w}Te$ | 1.50 eV/CdTe | 1.10 eV/$Hg_xCd_{1-x}Te$ | 0.68 eV/$Hg_xCd_{1-x'}Te$ | where $0 < w < w' \leq 1$; $0 \leq x < 1$, $0 < x \leq x' < 1$, $0 < y < y' \leq 1$; $0 < z < z' \leq 1$.

It is advantageous to form a tunnel junction comprising Group II-VI semiconducting material in between each subcell to provide a non-blocking path for the series current generated by the subcells and passing through them. Thus, the method further includes forming (106, FIG. 1) a first tunnel junction 216 over the first subcell 204 after forming (104) the first subcell 204. The step of forming (106) the first tunnel junction 216 comprises the substeps of forming (132) a highly or degeneratively doped first layer 218 having the first conductivity type on the first base 214 and forming (134) forming a highly or degeneratively doped second layer 220 having the second conductivity type on the first layer 218. Additional tunnel junctions 306, 310 may be formed in a similar manner as the first tunnel junction 106 so that additional tunnel junctions 306, 310 are formed (124) between the second subcell 206 and a third subcell 308 as well as between the third subcell 308 and a fourth subcell 312. Preferably, each tunnel junction 216, 306, 310 has a bandgap that is higher than the bandgap for either the next previous subcell or the subsequently-formed subcells and comprises at least one semiconductor layer that is made of ZnTe, ZnS, MgTe, CdZnTe, CdMgTe, or a combination thereof. The tunnel junctions 216, 306, 310 should be thin enough, and the change in energy levels in the valence and conduction bands abrupt enough, that efficient tunneling across the junction by electrons and holes will take place.

Once the desired number of layers or subcells is formed, the method continues with a step of affixing (110, FIG. 1) a support layer 228, which may further include a distinct contact layer 226 above or beneath, to be proximate to, preferably adjacent to, the last created subcell and to be remote from the first subcell 204. The contacting layer 226 may be in back of the support layer 228 (not shown), in front of the support layer as shown, or may be the support layer itself (not shown). The support layer 228 may be made of a rigid material such as silicon or of a flexible material such as a metallic foil.

After the support layer has been affixed, the substrate 202 is removed at step 114. The substrate 202 can be removed with a variety of techniques including chemical etching, plasma etching, and/or ion cutting. Preferably, the step of removing (114) the substrate 202 comprises the substeps of chemically etching (146) the substrate 202 with an acid etch and subsequently etching (148) the substrate 202 with an inductively coupled plasma etch. A preferred chemical etchant comprises a mixture of hydrofluoric acid, nitric acid, and acetic acid in a 3:5:3 ratio, referred to hereinafter as "CP4."

Alternatively, the substrate 202 can be removed by ion cutting the substrate 202 from photovoltaic cell. A complete description of the ion cutting technique is disclosed in U.S. Pat. No. 6,346,458 B1 to Bower, which is expressly incorporated by reference into this disclosure.

After removing (114) the substrate 202, the method continues with a step of forming (116) a front contact 304 (FIG. 3) to be proximate to, and preferably adjacent to, the first subcell 204 and to be remote from the second subcell 206. Thereafter, an antireflection coating 302 (ARC) may be formed above the front contact 304 at step 118. The front contact 304 consists of a metal grid and/or a thin sheet of a transparent conductive oxide (TCO) such as such as $Cd_2SnO_4$, $SnO_2$, ZnO, or indium tin oxide (ITO).

The antireflection coating (ARC) minimizes surface reflections, thereby enabling more photons of the incident light to enter the photovoltaic solar cell, and can also be used as an encapsulant for radiation hardening to improve radiation tolerance against damage from high energy photons and charged particles. The ARC has a relatively wide energy gap ($E_{gARC} \approx 3.20$ eV) in comparison to the energy gap of the subcells that it is protecting, and a relatively thin layer thickness ($d_{ARC} \approx 0.05$ to 0.5 μm). It preferably comprises a material selected from the group consisting of $Cd_2SnO_4$, $SnO_2$, ZnSe, $TiO_2$, MgTe, ZnO, ZnS, MgSe, ITO, MgS, MgO, $SiO_2$, and $MgF_2$. In addition, the ARC can be made by stacking together multiple thin layers of appropriate thicknesses from the materials listed above to further reduce the reflection of the incident light at the top surfaces.

In summary, the described method of forming a Group II-VI multi junction semiconductor device eliminates the lattice matching that is necessary when using Group III-V semiconductor layers. This allows for more flexibility in selecting the bandgap of each layer. Also, it provides a more robust physical structure.

While illustrated embodiments of the present invention have been described and illustrated in the appended drawings, the present invention is not limited thereto but only by the scope and spirit of the appended claims.

We claim:

1. A method of forming a Group II-VI multijunction semiconductor solar cell, comprising the steps of:
   providing a silicon growth substrate;
   forming, on the growth substrate, a passivation layer including Arsenic:
   forming, on the passivation layer, a buffer layer of zinc telluride, a lattice constant of the buffer layer being substantially mismatched to a lattice constant of the growth substrate;
   forming, on the buffer layer, a first subcell from a first Group II-VI semiconductor material selected from the group consisting of CdTe, $Cd_wMn_{1-w}Te$, $Hg_xCd_{1-x}Te$, $Cd_yZn_{1-y}Te$, $Cd_zMg_{1-z}Te$, CdSe, $Cd_aMn_{1-a}Se$, $Hg_bCd_{1-b}Se$, $Cd_cZn_{1-c}Se$, $Cd_dMg_{1-d}Se$ and combinations thereof, where $0<w<1$, $0<x<1$, $0<y<1$, $0<z<1$, $0<a<1$, $0<b<1$, $0<c<1$ and $0<d<1$, the first subcell having a lattice constant substantially mismatched to the lattice constant of the growth substrate, the first subcell having a first band gap;
   forming, over the first subcell, a second subcell from a second Group II-VI semiconductor material selected from the group consisting of CdTe, $Cd_wMn_{1-w}Te$, $Hg_xCd_{1-x}Te$, $Cd_yZn_{1-y}Te$, $Cd_zMg_{1-z}Te$, CdSe, $Cd_aMn_{1-a}Se$, $Hg_bCd_{1-b}Se$, $Cd_cZn_{1-c}Se$, $Cd_dMg_{1-d}Se$ and combinations thereof, where $0<w<1$, $0<x<1$, $0<y<1$, $0<z<1$, $0<a<1$, $0<b<1$, $0<c<1$ and $0<d<1$, the second subcell having a lattice constant substantially mismatched to the lattice constant of the growth substrate, the second subcell having a second band gap that is smaller than the first band gap;
   affixing a back support such that the back support is proximate the second subcell and remote from the first subcell; and
   removing the growth substrate.

2. The method of claim 1, wherein the passivation layer is arsenic.

3. The method of claim 1, further comprising:
   after said step of forming the second subcell, forming a back contact to be proximate the second subcell and remote from the first subcell.

4. The method of claim 3, wherein the back contact is adjacent to the second subcell.

5. The method of claim 1, further comprising: after said step of removing the growth substrate, forming a front contact to be proximate to the first subcell and remote from the second subcell.

6. The method of claim 5, wherein the front contact is formed to be adjacent to the first subcell.

7. The method of claim 1, further comprising a step of forming a homojunction in each of the first and second subcells.

8. The method of claim 1, wherein the step of forming the first subcell comprises the substeps of:
   forming a first emitter having a first conductivity type to be adjacent to the growth substrate; and
   forming a first base having a second conductivity type on the first emitter, the second conductivity type being opposite the first conductivity type.

9. The method of claim 8, further comprising:
   after the step of forming the first subcell, foming, over the first subcell a first tunnel junction of Group II-VI semiconducting material selected from the group consisting of ZnTe, ZnS, MgTe, $Cd_eZn_{1-e}Te$, $Cd_fMg_{1-f}Te$ and combinations thereof, where $0<e<1$ and $0<f<1$.

10. The method of claim 9, wherein the step of forming the first tunnel junction comprises the substeps of:
    forming a highly doped first layer having the first conductivity type on the first base; and
    forming a highly doped second layer having the second conductivity type on the first layer.

11. The method of claim 1, wherein the step of removing the growth substrate comprises the substeps of:
    chemically etching the substrate with CP4; and
    following the chemical etch, etching the growth substrate with an inductively coupled plasma process.

12. The method of claim 1, wherein the step of removing the growth substrate comprises the substep of ion cutting.

13. The method of claim 1, further comprising forming a third subcell from a third Group II-VI semiconductor material and having a third band gap over the second subcell, the third band gap being lower than the second band gap.

14. The method of claim 13, wherein the third Group II-VI semiconductor material is $Hg_xCd_{1-x}Te$, the third band gap is about 0.95 eV, the second Group II-VI semiconductor material is $Hg_{x'}Cd_{1-x'}Te$, where x'>x, the second band gap is about 1.4 eV, the first GroupII-VI semiconductor material is $Cd_yZn_{1-y}Te$, and the first band gap is about 1.96 eV.

15. The method of claim 13, wherein the third Group II-VI semiconductor material is $Hg_xCd_{1-x}Te$, the third band gap is about 0.95 eV, the second Group II-VI semiconductor material is $Hg_{x'}Cd_{1-x'}Te$, where x'>x the second band gap is about 1.4 eV, the first Group II-VI semiconductor material is $Cd_zMg_{1-z}Te$, and the first band gap is about 1.96 eV.

16. The method of claim 13, wherein the third Group II-VI semiconductor material is $Hg_xCd_{1-x}Te$, the third band gap is about 1.08 eV, the second Group II-VI semiconductor material is CdTe, the second band gap is about 1.5 eV, the first GroupII-VI semiconductor material is $Cd_yZn_{1-y}Te$, and the first band gap is about 2.04 eV.

17. The method of claim 13, wherein the third Group II-VI semiconductor material is $Hg_xCd_{1-x}Te$, the third band gap is about 1.08 eV, the second Group II-VI semiconductor material is CdTe, the second band gap is about 1.5 eV, the first Group II-VI semiconductor material is $Cd_zMg_{1-z}Te$, and the first band gap is about 2.04 eV.

18. The method of claim 13, wherein the third Group Ii-VI semiconductor material is $Hg_xCd_{1-x}Te$, the third band gap is about 0.95 eV, the second GroupII-VI semiconductor material is $Hg_{x'}Cd_{1-x'}Te$, where x'>x, the second band gap is about 1.4 eV, the first Group II-VI semiconductor material is $Cd_wMn_{1-w}Te$, and the first band gap is about 1.96 eV.

19. The method of claim 13, wherein the third Group II-VI semiconductor material is $Hg_xCd_{1-x}Te$, the third band gap is about 1.08 eV, the second Group II-VI semiconductor material is CdTe, the second band gap is about 1.5 eV, the first Group II-VI semiconductor material is $Cd_wMn_{1-w}Te$, and the first band gap is about 2.04 eV.

20. The method of claim 13, further comprising the step of forming a fourth subcell from a fourth Group II-VI semiconductor material and having a fourth band gap over the third subcell, the fourth band gap being lower than the third band gap.

21. The method of claim 20, wherein the fourth Group II-VI semiconductor material is $Hg_xCd_{1-x}Te$, the fourth band gap is about 0.75 eV, the third Group II-VI semiconductor material is $Hg_xCd_{1-x}Te$, where x'>x, the third band gap is about 1.16 eV, the second Group II-VI semiconductor material is $Cd_{y'}Zn_{1-y'}Te$, the second band gap is about 1.55 eV, and the first Group II-VI semiconductor material is $Cd_yZn_{1-y}Te$, where y'>y, and the first band gap is about 2.08 eV.

22. The method of claim 20, wherein the fourth Group II-VI semiconductor material is $Hg_xCd_{1-x'}Te$, the fourth band gap is about 0.75 eV, the third Group II-VI semiconductor material is $Hg_xCd_{1-x}Te$, where x'>x, the third band gap is about 1.16 eV, the second Group II-VI semiconductor material is $Cd_zMg_{1-z}Te$, the second band gap is about 1.55 eV, and the first Group II-VI semiconductor material is $Cd_yZn_{1-y}Te$, and the first band gap is about 2.08 eV.

23. The method of claim 20, wherein the fourth Group II-VI semiconductor material is $Hg_xCd_{1-x'}Te$, the fourth band gap is about 0.75 eV, the third Group II-VI semiconductor material is $Hg_xCd_{1-x}Te$, where x'>x, the third band gap is about 1.16 eV, the second Group II-VI semiconductor material is $Cd_yZn_{1-y}Te$, the second band gap is about 1.55 eV, the first Group II-VI semiconductor material is $Cd_zMg_{1-z}Te$, and the first band gap is about 2.08 eV.

24. The method of claim 20, wherein the fourth Group II-VI semiconductor material is $Hg_xCd_{1-x'}$, the fourth band gap is about 0.75 eV, the third Group II-VI semiconductor material is $Hg_xCd_{1-x}Te$, where x'>x, the third band gap is about 1.16 eV, the second Group II-VI semiconductor material is $Cd_{z'}Mg_{1-z'}Te$, the second band gap is about 1.55 eV, the first Group II-VI semiconductor material is $Cd_zMg_{1-z}Te$, where z'>z, and the first band gap is about 2.08 eV.

25. The method of claim 20, wherein the fourth Group II-VI semiconductor material is $Hg_xCd_{1-x'}$, the fourth band gap is about 0.68 eV, the third Group II-VI semiconductor material is $Hg_xCd_{1-x}Te$, where x'>x, the third band gap is about 1.1 eV, the second Group II-VI semiconductor material is CdTe, the second band gap is about 1.5 eV, the first Group II-VI semiconductor material is $Cd_yZn_{1-y}Te$, and the first band gap is about 2.04 eV.

26. The method of claim 20, wherein the fourth Group II-VI semiconductor material is $Hg_xCd_{1-x}Te$, the fourth band gap is about 0.68 eV, the third Group II-VI semiconductor material is $Hg_xCd_{1-x}Te$, where x'>x, the third band gap is about 1.1 eV, the second Group II-VI semiconductor material is CdTe, the second band gap is about 1.5 eV, the first Group II-VI semiconductor material is $Cd_zMg_{1-z}Te$, and the first band gap is about 2.04 eV.

27. The method of claim 20, wherein the fourth Group II-VI semiconductor material is $Hg_xCd_{1-x'}Te$, the fourth band gap is about 0.75 eV, the third Group II-VI semiconductor material is $Hg_xCd_{1-x}Te$, where x'>x, the third band gap is about 1.16 eV, the second Group II-VI semiconductor material is $Cd_wMn_{1-w}Te$, the second band gap is about 1.55 eV, the first Group II-VI semiconductor material is $Cd_yZn_{1-y}Te$, and the first band gap is about 2.08 eV.

28. The method of claim 20, wherein the fourth Group II-VI semiconductor material is $Hg_xCd_{1-x}Te$, the fourth band gap is about 0.75 eV, the third Group II-VI semiconductor material is $Hg_xCd_{1-x}Te$, where x'>x, the third band gap is about 1.16 eV, the second Group II-VI semiconductor material is $Cd_yZn_{1-y}Te$, the second band gap is about 1.55 eV, the first Group II-VI semiconductor material is $Cd_wMn_{1-w}Te$, and the first band gap is about 2.08 eV.

29. The method of claim 20, wherein the fourth Group II-VI semiconductor material is $Hg_xCd_{1-x}Te$, the fourth band gap is about 0.75 eV, the third Group II-VI semiconductor material is $Hg_xCd_{1-x}Te$, where x'>x, the third band gap is about 1.16 eV, the second Group II-VI semiconductor material is $Cd_wMn_{1-w}Te$, the second band gap is about 1.55 eV, the first Group II-VI semiconductor material is $Cd_{w'}Mn_{1-w'}Te$, where w'>w, and the first band gap is about 2.08 eV.

30. The method of claim 20, wherein the fourth Group II-VI semiconductor material is $Hg_xCd_{1-x'}Te$, the fourth band gap is about 0.68 eV, the third Group II-VI semiconductor material is $Hg_xCd_{1-x}Te$, where x'>x, the third band gap is about 1.1 eV, the second Group II-VI semiconductor material is CdTe, the second band gap is about 1.5 eV, the first Group II-VI semiconductor material is $Cd_wMn_{1-w}Te$, and the first band gap is about 2.04 eV.

31. The method of claim 1, wherein the steps of forming the first and second subcells are performed through the process of molecular beam epitaxy.

32. The method of claim 20, wherein the first, second, third, and fourth subcells are formed in a single run by molecular beam epitaxy.

33. A method of forming a Group II-VI multijunction semiconductor solar cell, comprising the steps of:
providing a growth substrate of Group IV semiconductor material, a growth surface of the growth substrate presenting a first lattice constant;
forming, on the growth substrate, a passivation layer including Arsenic;
forming, on the passivation layer, a buffer layer of zinc telluride, a lattice constant of the buffer layer being substantially mismatched to the first lattice constant;
forming, on the buffer layer, a first subcell from a first Group II-VI semiconductor material selected from the group consisting of CdTe, $Cd_wMn_{1-w}Te$, $Hg_xCd_{1-x}Te$, $Cd_yZn_{1-y}Te$, $Cd_zMg_{1-z}Te$, CdSe, $Cd_aMn_{1-a}Se$, $Hg_bCd_{1-b}Se$, $Cd_dMg_{1-d}Se$ and combinations thereof, where 0<w<1, 0<x<1, 0<y<1, 0<z<1, 0<a<1, 0<b<1 and 0<d<1, the first subcell having a lattice constant substantially mismatched to the first lattice constant and having a first band gap;
forming, over the first subcell, a second subcell from a second Group II-VI semiconductor material selected from the group consisting of CdTe, $Cd_wMn_{1-w}Te$, $Hg_xCd_{1-x}Te$, $Cd_yZn_{1-y}Te$, $Cd_zMg_{1-z}Te$, CdSe, $Cd_aMn_{1-a}Se$, $Hg_bCd_{1-b}Se$, $Cd_dMg_{1-d}Se$, and combinations thereof, where 0<w<1, 0<x<1, 0<y<1, 0<z<1, 0<a<1, 0<b<1 and 0<d<1, the second subcell having a lattice constant substantially mismatched to the first lattice constant, the second subcell having a second band gap that is smaller than the first band gap;
affixing a back support such that the back support is proximate the second subcell and remote from the first subcell; and
removing the growth substrate.

34. The method of claim 33, wherein the passivation layer consists of arsenic.

35. The method of claim 33, wherein the step of forming the first subcell comprises the substeps of forming a first emitter to have a first conductivity type and to be proximate the growth substrate, and forming a first base to have a second conductivity type opposite the first conductivity type and to be remote from the growth substrate, the method further comprising:
after the step of forming the first subcell, forming, over the first subcell, a first tunnel junction of Group II-VI semiconductor material selected from the group consisting of ZnTe, ZnS, MgTe, $Cd_eZn_{1-e}Te$, $Cd_fMg_{1-f}Te$ and combinations thereof, where 0<e<1 and 0<f<1, the step of forming the first tunnel junction comprising the substeps of forming, on the first base, a degeneratively doped first layer having the first conductivity type, and forming, on the first layer, a degeneratively doped second layer having the second conductivity type.

36. The method of claim 33, further comprising forming, over the second subcell, a third subcell from a third Group II-VI semiconductor material, the third Group II-VI semiconductor material having a third band gap which is lower than the second band gap.

37. The method of claim 36, further comprising forming, over the third subcell, a fourth subcell from a fourth Group II-VI semiconductor material, the fourth Group II-VI semiconductor material having a fourth band gap which is lower than the third band gap.

* * * * *